(12) United States Patent
Heiss et al.

(10) Patent No.: US 12,156,488 B2
(45) Date of Patent: Nov. 26, 2024

(54) PHASE CHANGE SWITCH WITH MULTI FACE HEATER CONFIGURATION

(71) Applicant: Infineon Technologies AG, Neubiberg (DE)

(72) Inventors: Dominik Heiss, Munich (DE); Martin Bartels, Dresden (DE); Christoph Glacer, Munich (DE); Christoph Kadow, Gauting (DE); Matthias Markert, Dresden (DE); Hans Taddiken, Munich (DE); Hans-Dieter Wohlmuth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/086,211

(22) Filed: Dec. 21, 2022

(65) Prior Publication Data
US 2023/0119033 A1    Apr. 20, 2023

Related U.S. Application Data

(62) Division of application No. 16/844,450, filed on Apr. 9, 2020, now Pat. No. 11,563,174.

(51) Int. Cl.
*H10N 70/00*    (2023.01)
*H10N 70/20*    (2023.01)

(52) U.S. Cl.
CPC ....... *H10N 70/8613* (2023.02); *H10N 70/021* (2023.02); *H10N 70/231* (2023.02); *H10N 70/823* (2023.02); *H10N 70/841* (2023.02)

(58) Field of Classification Search
CPC .................................................. H01L 45/1608
See application file for complete search history.

(56) References Cited

U.S. PATENT DOCUMENTS

| | | | |
|---|---|---|---|
| 9,647,209 B2 | 5/2017 | Goktepeli et al. | |
| 2014/0061574 A1* | 3/2014 | Pio | H01L 27/224 257/E45.001 |
| 2016/0079019 A1* | 3/2016 | Borodulin | H01L 45/1286 337/396 |
| 2020/0058862 A1* | 2/2020 | Howard | H01L 45/16 |

* cited by examiner

*Primary Examiner* — Moazzam Hossain
*Assistant Examiner* — Hajar Kolahdouzan
(74) *Attorney, Agent, or Firm* — Murphy, Bilak & Homiller, PLLC

(57) ABSTRACT

A method includes providing a substrate having a main surface, forming a layer of thermally insulating material on the main surface, forming strips of phase change material on the layer of thermally insulating material such that strips of phase change material are separated from the main surface by thermally insulating material, forming first and second RF terminals on the main surface that are laterally spaced apart from one another and connected to the strips of phase change material, and forming a heater structure having heating elements that are configured to control a conductive connection between the first and second RF terminals by applying heat to the one or more strips of phase change material, wherein each of the strips of phase change material includes multiple outer faces, and wherein portions of both outer faces from the strips of phase change material are disposed against one of the heating elements.

4 Claims, 8 Drawing Sheets

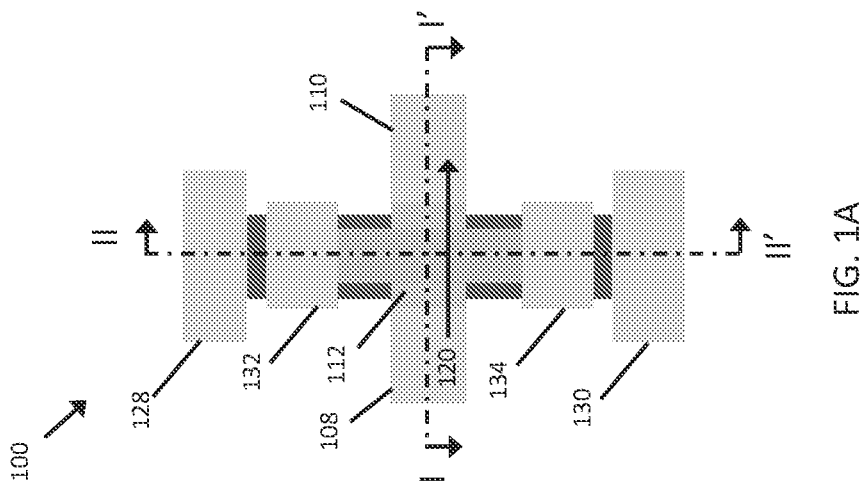
FIG. 1A
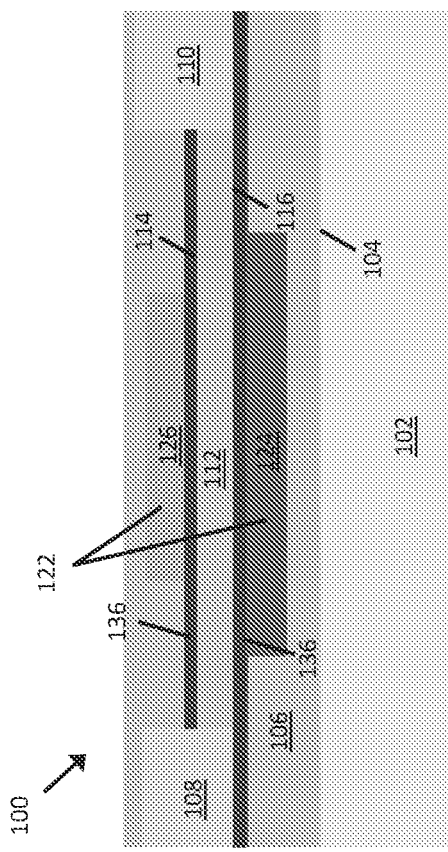
FIG. 1B
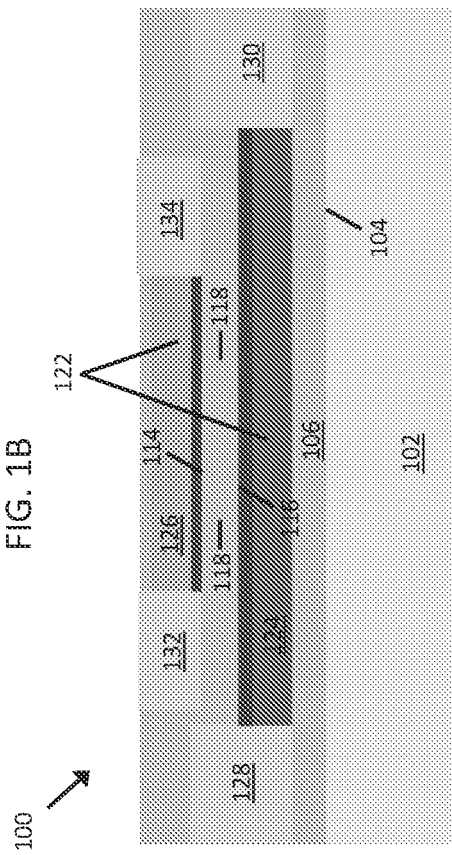
FIG. 1C
FIGURE 1

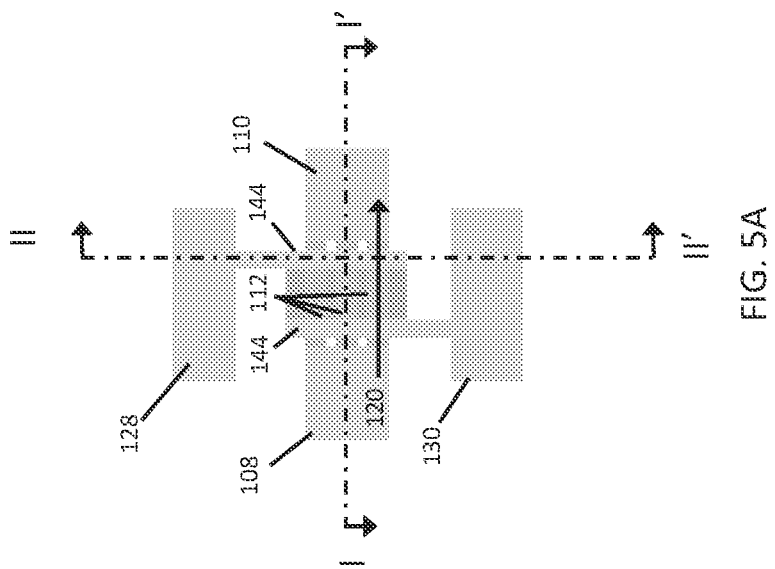
FIG. 5A
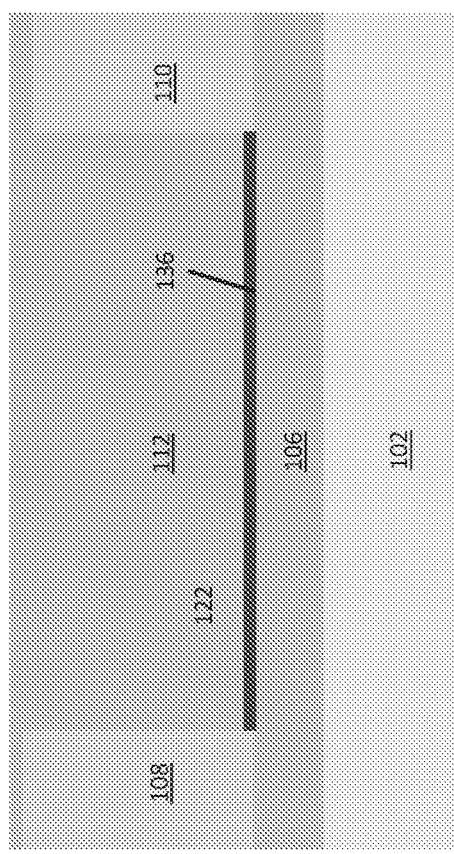
FIG. 5B
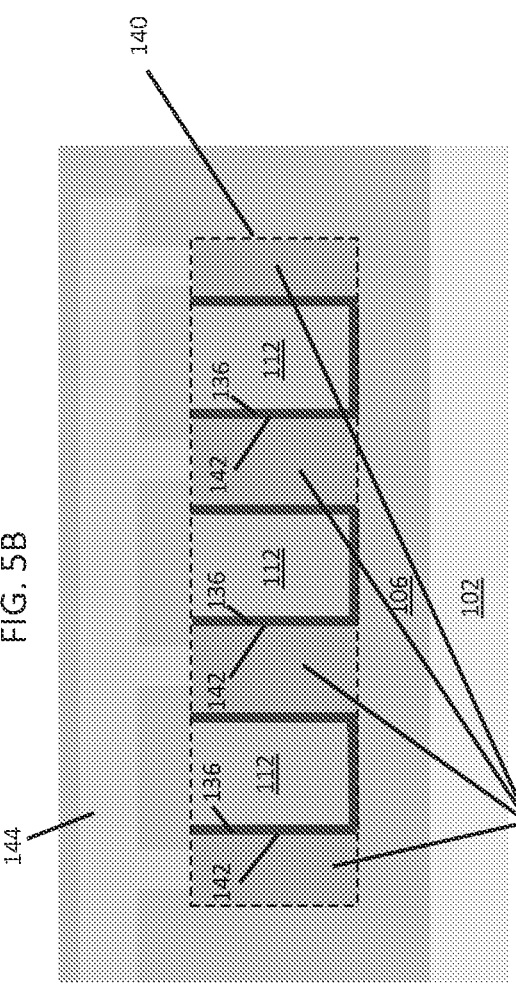
FIG. 5C
FIGURE 5

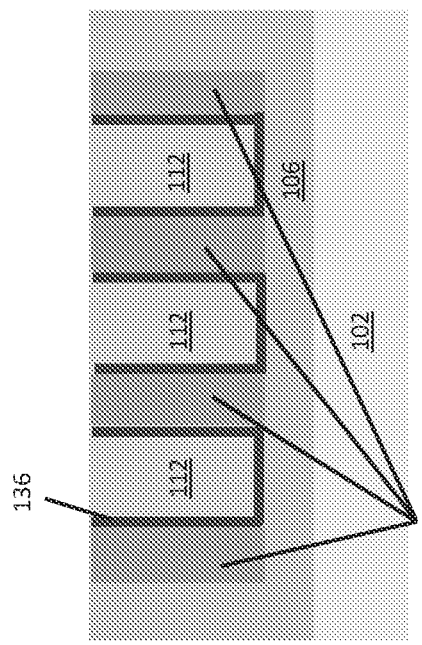
FIG. 6C
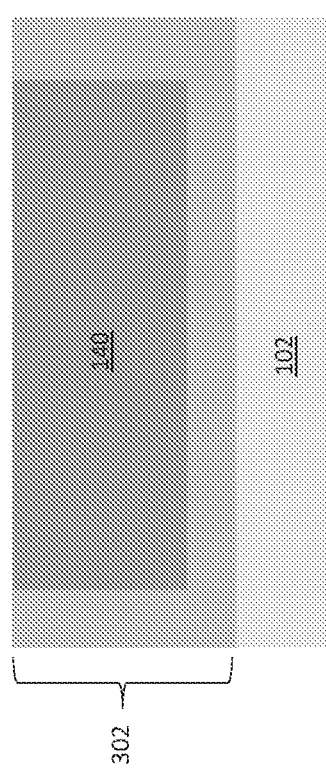
FIG. 6A
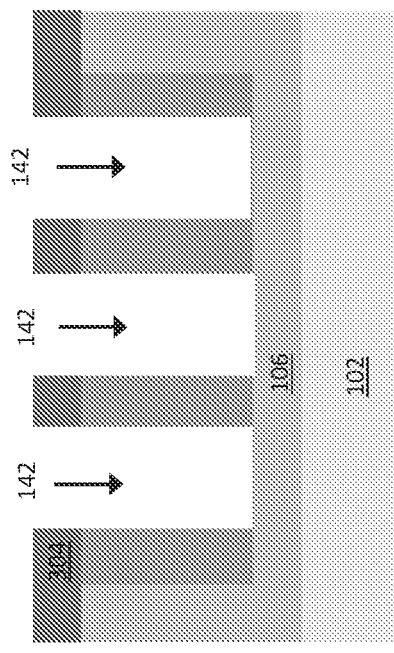
FIG. 6B
FIGURE 6

PHASE CHANGE SWITCH WITH MULTI FACE HEATER CONFIGURATION

BACKGROUND

Modern electronics applications require switching devices capable of accommodating very high frequency signals. For example, fifth generation wireless applications (5G) will operate in frequency bands of 27 GHz (gigahertz) or greater. Maintaining the correct ON/OFF ratio/isolation versus insertion loss/$R_{ON}$ (on-resistance) and $C_{OFF}$ (off-capacitance) is difficult or impossible to achieve in current semiconductor switching technologies, such as CMOS technology. Phase change switches represent one promising alternative technology that can meet these design requirements for high frequency applications. A phase change switch utilizes a phase change material to control a conductive connection between two terminals. The switching operation is performed by transitioning the phase change material between states, e.g., through the application of heat to the phase change material. While promising, phase change switches are in the early stages of development and some design challenges are yet to be resolved. For example, device parameters such as $R_{ON}$ (on-resistance) $C_{OFF}$ (off-capacitance), power consumption, linearity, etc., that are needed in electronics applications such as RF-switches for mobile phones are difficult to meet in current phase change switch designs while maintaining acceptable device area requirements.

SUMMARY

A switching device is disclosed. According to an embodiment, the switching device comprises a substrate comprising a main surface, first and second RF terminals disposed over the main surface and laterally spaced apart from one another, one or more strips of phase change material connected between the first and second RF terminals, a region of thermally insulating material that separates the one or more strips of phase change material from the main surface, and a heater structure comprising one or more heating elements that are configured to control a conductive connection between the first and second RF terminals by applying heat to the one or more strips of phase change material. Each of the one or more strips of phase change material comprises a first outer face and a second outer face opposite from the first outer face. For at least one of the one or more strips of phase change material, at least portions of both of the first and second outer faces are disposed against one of the heating elements.

Separately or in combination, the switching device comprises a plurality of the strips of phase change material, and wherein sections of the one or more heating elements are arranged alternatingly between each of the strips of phase change material.

Separately or in combination, each of the strips of phase change material are laterally spaced apart from one another in a lateral direction that is parallel to the main surface and transverse to a current flow direction in the strips of phase change material.

Separately or in combination, the first and second outer faces of each of the strips of phase change material are oriented substantially perpendicular to the main surface, each of the strips of phase change material comprise a top outer face that is substantially parallel to the main surface and extends between the first and second outer faces of the respective strip, and a first one of the heating elements wraps around the first outer face, the top outer face, and the second outer face of each of the strips of phase change material.

Separately or in combination, the switching device further comprises first and second heating terminals, the first heating element is connected between the first and second heating terminals, the first and second heating terminals are configured to apply the heat by forcing current through the first heating element, and the heater structure is configured to force the current through the first heating element in a direction that is transverse to the current flow direction of the phase change material.

Separately or in combination, each of the strips of phase change material are elongated in a vertical direction that is perpendicular to the main surface.

Separately or in combination, the switching device comprises a region of heating element material disposed on the region of thermally insulating material, the region of heating element material comprising an upper surface that is substantially parallel to the main surface, and a plurality of trenches formed in the upper surface of the region of heating element material, the strips of phase change material are disposed within the trenches, and the heater structure comprises a plurality of the heating elements, and each of the heating elements is formed by a section of the heating element material that is disposed between two of the trenches.

Separately or in combination, the heater structure is configured to force current through each of the heating elements in a direction that is parallel to the current flow direction of the phase change material.

Separately or in combination, the heater structure is configured to force current through each of the heating elements in a direction that is transverse to the current flow direction of the phase change material.

Separately or in combination, each of the strips of phase change material are spaced apart from one another in a vertical direction that is perpendicular to the main surface, and the heater structure comprises a plurality of the heating elements arranged alternatingly between the strips of phase change material in the vertical direction.

Separately or in combination, each of the strips of phase change material is electrically connected in series with one another the between the first and second RF terminals.

Separately or in combination, each of the strips of phase change material is electrically connected in parallel with one another between the between the first and second RF terminals.

Separately or in combination, the first and second outer faces of the one or n ore strips of phase change material are oriented substantially parallel to the main surface, wherein the heater structure comprises a first heating element that is disposed below the first outer face of the one or more strips of phase change material and a second heating element that is disposed above the second outer face of the one or n ore strips of phase change material.

Separately or in combination, the first heating element comprises a first heating element material, and the second heating element comprises a second heating material that is different fro the first heating element material.

Separately or in combination, the switching device comprises a plurality of the strips of phase change material, for a first strip of phase change material from the plurality at least portions of both of the first and second outer faces are disposed against one of the heating elements, and wherein for a second strip of phase change material from the plurality only one of the first and second outer faces are disposed against one of the heating elements.

A method of forming a switching device is disclosed. According to an embodiment, the method comprises providing a substrate comprising a main surface, forming a layer of thermally insulating material on the main surface, forming one or more strips of phase change material on the layer of thermally insulating material such that the one or more strips of phase change material are separated from the main surface by a region of the thermally insulating material, forming first and second RF terminals on the main surface that are laterally spaced apart from one another and connected to the one or more strips of phase change material, and forming a heater structure comprising one or more heating elements that are configured to control a conductive connection between the first and second RF terminals by applying heat to the one or more strips of phase change material Each of the one or more strips of phase change material comprises a first outer face and a second outer face opposite from the first outer face. For at least one of the one or more strips of phase change material, at least portions of both of the first and second outer faces are disposed against one of the heating elements.

Separately or in combination, forming the one or more strips of phase change material comprises forming a plurality of the strips of phase change material, and forming the heater structure comprises forming sections of the one or more heating elements that are arranged alternatingly between the strips of phase change material.

Separately or in combination, forming the one or more strips of phase change material comprises depositing a layer of the phase change material on the layer of thermally insulating material and structuring the layer of the phase change material to form a plurality of fin-shaped sections of the phase change material, and forming the heater structure comprises conformally depositing a strip of heater element material over the fin-shaped sections of the phase change material.

Separately or in combination, forming the heater structure comprises forming a region of the heater element material and forming a plurality of trenches in the region of heater element material, and forming the one or more strips of phase change material comprises depositing the phase change material within each of the trenches.

Separately or in combination, terming the sections of the one or more heating elements comprises depositing a plurality of layers of heating element material that are stacked on top of one another in a vertical direction that is perpendicular to the main surface, and forming the plurality of the strips of phase change material comprises depositing layers of the phase change material alternatingly between the of layers of heating element material.

Separately or in combination, forming the heater structure comprises depositing a first heating element material on the substrate before forming the one or more strips of phase change material and depositing a second heating element material on the one or more strips of phase change material.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A, 1B and 1C, depicts a PCM switching device, according to an embodiment. FIG. 1A depicts a planar view of the device, FIG. 1B depicts a cross-sectional view of the device along the plane I-I' identified in FIG. 1A, and FIG. 1C depicts a cross-sectional view of the device along the plane II-II' identified in FIG. 1A.

FIGS. 2A, 2B and 2C, depicts a PCM switching device, according to an embodiment. FIG. 2A depicts a planar view of the device, FIG. 2B depicts a cross-sectional view of the device along the plane I-I' identified in FIG. 2A, and FIG. 2C depicts a cross-sectional view of the device along the plane II-II' identified in FIG. 2A.

FIGS. 3A and 3B, depicts a PCM switching device, according to an embodiment. FIG. 3A depicts a planar view of the device, and FIG. 3B depicts a cross-sectional view of the device along the plane I-I' identified in FIG. 3A.

FIGS. 4A, 4B, and 4C, depicts a technique for forming a PCM switching device, according to an embodiment.

FIG. 5, which includes FIGS. 5A, 5B and 5C, depicts a PCM switching device, according to an embodiment. FIG. 5A depicts a planar view of the device, FIG. 5B depicts a cross-sectional view of the device along the plane I-I' identified in FIG. 5A, and FIG. 5C depicts a cross-sectional view of the device along the plane II-II' identified in FIG. 5A.

FIG. 6, which includes FIGS. 6A, 6B and 6C, depicts a technique for forming a PCM switching device, according to an embodiment.

FIGS. 7A, 7B and 7C, depicts a PCM switching device, according to an embodiment, FIG. 7A depicts a planar view of the device, FIG. 7B depicts a cross-sectional view of the device along the plane I-I' identified in FIG. 7A, and FIG. 7C depicts a cross-sectional view of the device along the plane II-II' identified in FIG. 7A.

FIGS. 8A, 8B and 8C, depicts a PCM switching device, according to an embodiment. FIG. 8A depicts a planar view of the device, FIG. 8B depicts a cross-sectional view of the device along the plane I-I' identified in FIG. 8A, and FIG. 8C depicts a cross-sectional view of the device along the plane II-II' identified in FIG. 8A.

DETAILED DESCRIPTION

Figure 2:
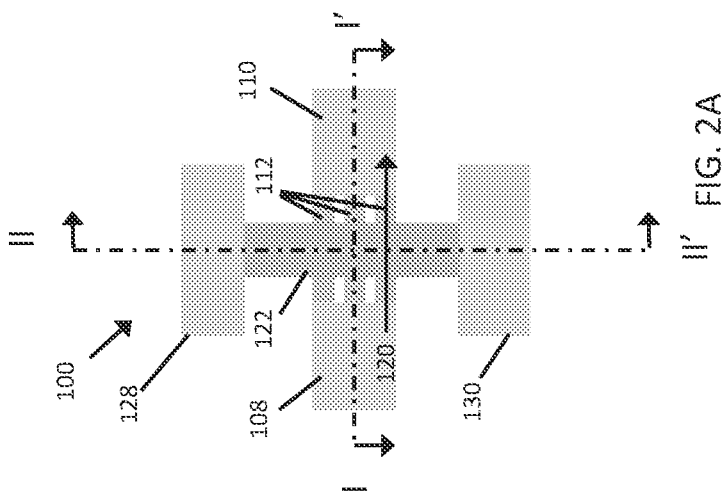
FIG. 2, which includes
Figure 2:
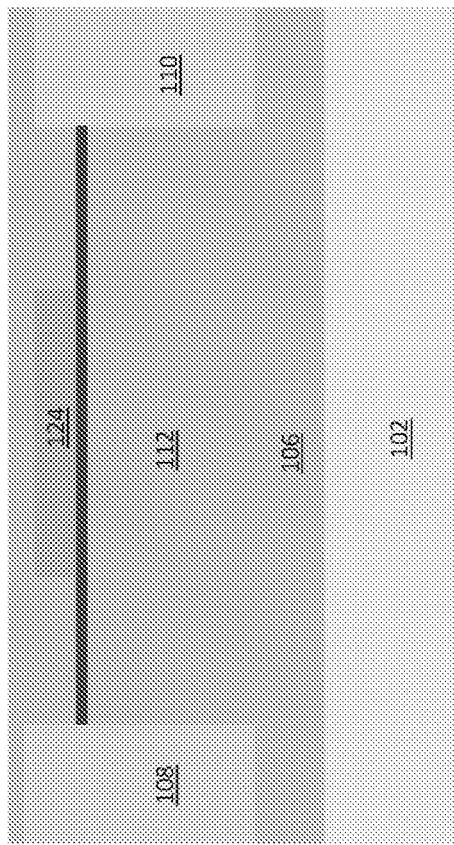
Figure 2:
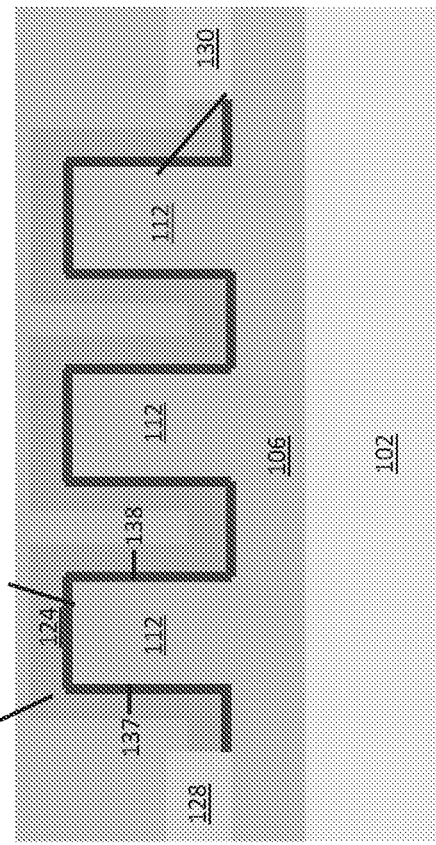

Embodiments of a PCM (phase change material) switching device are described herein. Advantageously, the PCM switching device includes a heater structure that applies heat to opposite facing outer faces of the phase change material. This multi-faced heating produces a substantially homogenous temperature profile within the phase change material. This allows for better control of the phase transition, which leads to improved performance parameters (e.g. $R_{ON}$, $C_{OFF}$, etc.) for a device of given areal footprint in comparison to a one-sided heater configuration. In embodiments, the PCM switching device includes multiple strips of phase change material arranged alternatingly between heating elements. This design provides a high-density of the phase change material within a given area, which enables improved current carrying capacity and/or blocking capability. Moreover, in these embodiments, each strip of phase change material has the advantageous multi-faced heating structure. Corresponding methods are described herein to produce these device arrangements with a relatively low number of processing steps, including steps that are typically implemented in silicon technology.

Referring to FIG. 1, a PCM switching device 100 is depicted, according to an embodiment. The PCM switching device 100 includes a substrate 102. Generally speaking, the substrate 102 may include any material that is compatible with semiconductor processing techniques, e.g., deposition, etching, etc. For example, the substrate 102 may include semiconductor materials such as silicon (Si), carbon, silicon carbide (SiC), silicon germanium (SiGe), etc. In another example, the substrate 102 includes non-semiconductor material, e.g., sapphire, glass, diamond, etc. In one particular embodiment, the substrate 102 is a commercially available bulk semiconductor wafer, e.g., a silicon wafer. In another example, the substrate 102 is a so-called SOI (Silicon on Insulator) substrate, which includes a buried layer of insulating material. The substrate 102 includes a main surface 104, which may be a substantially planar surface.

The PCM switching device 100 includes a region of thermally insulating material 106 that is formed on the main surface 104 of the substrate 102. Generally speaking, the region of thermally insulating material 106 can include any thermal insulator that can be formed through typical semiconductor processing techniques such as CVD (chemical vapour deposition). Examples of these thermally insulating materials include oxides and nitrides, e.g., silicon nitride (SiN), silicon dioxide ($SiO_2$), silicon oxynitride ($SiO_XN_Y$), etc. The region of thermally insulating material 106 may include multiple layers of the same or different material.

The PCM switching device 100 further includes first and second RF terminals 108, 110. The first and second RF terminals 108, 110 are electrically conductive structures that form the input/output terminals of the PCM switching device 100. The first and second RF terminals 108, 110 may include electrically conductive materials, e.g., copper, aluminum, alloys thereof, etc. The first and second RF terminals 108, 110 may be configured as externally accessible terminals of the PCM switching device 100. Alternatively, the first and second RF terminals 108, 110 may be lower level terminals that are interconnected to other devices and/or externally accessible terminals of the PCM switching device 100 by metallization layers (not shown).

The PCM switching device 100 further includes a strip of phase change material 112. The term "strip" means that the phase change material has an elongated geometry along the main surface 104 of the substrate 102 with substantially planar outer faces. In the depicted embodiment, the strip of phase change material 112 includes top and bottom outer faces 114, 116 that are substantially parallel to the main surface 104 of the substrate 102, and side outer faces 118 that are substantially perpendicular to the main surface 104 of the substrate 102. Thus, the strip of phase change material 112 has a rectangular cuboid configuration. Other cross-sectional geometries are possible.

The phase change material of the strip of phase change material 112 is a material that can be transitioned between two different phases that each have different electrical conductivity. For example, the phase change material may be a material that changes from an amorphous state to a crystalline state based upon the application of heat to the phase change material, wherein the phase change material is electrically insulating (i.e., blocks a conductive connection) in the amorphous state and is electrically conductive provides a low-resistance current path) in the crystalline state. Generally speaking, phase change materials having this property include chalcogenides and chalcogenide alloys. Specifically, these phase change materials include germanium-antimony-tellurium (GST), germanium-tellurium, and germanium-antimony.

The strip of phase change material 112 is connected between the first and second RF terminals 108, 110. This means that the strip of phase change material 112 is in low-ohmic contact with both the first and second RF terminals 108, 110, either through direct physical contact or by conductive intermediaries. In one example, a conductive material such as TiN, W, TiPtAu is provided between the first and second RF terminals 108, 110 and the phase change material to improve the electrical connection between the two. When the strip of phase change material 112 is in a conductive state, current flows between the first and second RF terminals 108, 110 in a current flow direction 120 of the phase change material.

The PCM switching device 100 further includes a heater structure 122. The heater structure 122 includes heating elements that are used to heat the phase change material. The heating elements include a strip or layer of heating element material that converts electrical energy into heat through ohmic heating. Generally speaking, the heating element material may include a wide variety of conductive materials including metals such as copper, aluminum, tantalum, tungsten, nickel, etc. and alloys thereof, and semiconductors (doped or undoped) such as ceramic, silicon, polysilicon, silicon carbide, etc.

In the depicted embodiment, the heater structure 122 includes a first heating element 124 that is below the strip of phase change material 112 and a second heating element 126 that is above the strip of phase change material 112. According to an embodiment, the first heating element 124 includes a first heating element material and the second heating element 126 includes a second heating element material that is different from the first heating element material. Generally speaking, the first and second heating element materials can be any two different ones of the above listed conductors and/or semiconductors. In one specific example of this embodiment, the first heating element material is polysilicon and the second heating element material is a metal, e.g., Tantalum Nitride or Tungsten. One benefit of this arrangement is that the first heating element 124 can be formed by front-end of the line processing, e.g., epitaxy, whereas the second heating element 126 can be formed by back-end of the line processing, e.g., metal deposition or plating.

The PCM switching device 100 further includes first, second, third and fourth heating terminals 128, 130, 132, 134. These heating terminals are electrically conductive structures that may include electrically conductive metals such as copper, aluminum, alloys thereof, etc. The first heating element 124 is electrically connected between the first and second heating terminals 128, 130. Likewise, the second heating element 126 is electrically connected between the third and fourth heating terminals 132, 134. The first and second heating terminals 128, 130 can be biased to force a current through the first heating element 124 such that the first heating element 124 generates heat. Likewise, the third and fourth heating terminals 132, 134 can be biased to force a current through the second heating element 126 such that the first heating element 126 generates heat.

The PCM switching device 100 further includes an insulating liner 136 disposed between the heating elements and the strip of phase change material 112. The insulating liner 136 is designed to electrically isolate the heating elements from the strip of phase change material 112 while simultaneously permitting substantial heat transfer between the two. To this end, the insulating liner 136 may be a relatively thin (e.g., less than 1 μm thick and more typically less than 100 nm thick) layer of dielectric material, e.g., silicon dioxide ($SiO_2$), silicon nitride (SiN), etc.

The working principle of the PCM switching device 100 is as follows. The heater structure 122 is configured to control a conductive connection between the first and second RF terminals 108, 110 by applying heat to the strip of phase change material 112. In an OFF state of the PCM switching device 100, the phase change material is in an amorphous state. As a result, the strip of phase change material 112 blocks a voltage applied to the first and second RF terminals 108, 110. In an ON state of the PCM switching device 100, the phase change material is in a crystalline state. As a result, the strip of phase change material 112 provides a low-resistance electrical connection between the first and second RF terminals 108, 110. The PCM switching device 100 performs a switching operation by using the first and second heating elements 124, 126 to heat the strip of phase change material 112. The phase change material may be transitioned to the amorphous state by applying a short pulses (e.g., pulses in the range of 50-500 nanoseconds) of high intensity heat which causes the phase change material to reach a melting temperature, e.g., in the range of 600° C. to 750° C., followed by a rapid cooling of the material. This is referred to as a "reset pulse." The phase change material may be transitioned to the crystalline state by applying longer duration pulses (e.g., pulses in the range of 0.5-10 microseconds) of lower intensity heat, which causes the phase change material to reach a temperature at which the material quickly crystallizes and is highly conductive, e.g., in the range of 250° C. to 350° C. This is referred to as a "set pulse."

The heater structure 122 of the PCM switching device 100 has an advantageous multi-face configuration herein the heating elements are disposed against two opposite facing outer faces of the strip of phase change material 112. This configuration mitigates any temperature gradient in the phase change material during the set and reset pulses. By way of comparison, in a single-face configuration wherein heat is only applied at one side of the phase change material, the heat distribution throughout the phase change material can be significantly asymmetric. Specifically, a single-face configuration may have a temperature gradient of 300° C. or greater between the surface of the phase change material that faces the heating element and the portions of the phase change material that are distal to the heating element. By contrast, the multi-face configuration of the embodiments described herein can ensure a temperature gradient of close to zero (e.g., less than 50° C.) within the strip of phase change material 112 during the set and reset pulses. As a result, the phase change material can be more uniformly and rapidly transitioned between the amorphous and crystalline states. This leads to performance benefits in the PCM switching device 100 including lower power consumption, increased linearity, and reduced chip area.

The advantageous multi-face configuration described above includes any arrangement wherein one of more heating elements are disposed against first and second outer faces of the strip of phase change material 112 that are opposite one another. In this context, faces are "opposite" one another if they extend transversely to one another and define a cross-sectional width or thickness of the phase change material. In the embodiment, of FIG. 1, the top and bottom outer faces 114, 116 of the strip of phase change material 112 are the two opposite faces that are heated by the heater structure 122. Alternatively, the side faces 118 of the of the strip of phase change material 112 may be the two opposite faces that are heated by the heater structure 122. Examples of these devices will be illustrated in detail below.

According to an embodiment, in an outer region of the strips of phase change material 112, only one of the outer faces are disposed against one of the heating elements. For example, as shown in FIG. 1B, the strip of phase change material 112 includes a central region wherein the first heating element 124 is disposed against the bottom outer face 114 and the second heating element 126 is disposed against the top outer face 116, and further includes outer regions on either side of a central region wherein the first heating element 124 is disposed against the bottom outer face 114 but second heating element 126 is not disposed against the top outer face 116.

A heater structure 122 with the advantageous multi-face configuration may be implemented in a variety of different ways. For example, the heater structure 122 may include multiple heating elements, i.e., separate spans of heating element material that carry separate currents, as is the case in the embodiment of FIG. 1. Alternatively, the heater structure 122 may include a single heating element that is configured to heat two faces of the phase change material by a single current. The current flow direction of the heater structure 122 may vary. For example, in the embodiment of FIG. 1, the heater structure 122 is configured to force current through the heating elements in a direction that is transverse to the current flow direction 120 of the phase change material. Alternatively, the heater structure 122 may be configured to force current through each of the heating elements in a direction that is parallel to the current flow direction 120 of the phase change material. In this arrangement, the heating element terminals may be arranged above or below the first and second RF terminals 108, 110.

Referring to FIG. 2, a PCM switching device 100 is depicted, according to another embodiment. In this embodiment, the device includes a plurality of the strips of phase change material 112, with sections of a first heating element 124 arranged alternatingly between each strip of phase change material 112. Each strip of phase change material 112 is laterally spaced apart from one another in a lateral direction. The lateral direction is parallel to the main surface 104 and transverse to a current flow direction 120 of the strips of phase change material 112. The heater structure 122 is configured to force current through the first heating element 124 in a direction that is transverse to the current flow direction 120 of the phase change material.

In the PCM switching device 100 of FIG. 2, the advantageous multi-face configuration is obtained by a wrap-around design of the heater structure 122. In more detail, each strip of phase change material 112 includes first and second side faces 137, 138 that are oriented transversely (e.g., substantially perpendicular) to the main surface 104 of the substrate 102, and a top face 114 that extends between the first and second side faces 137, 138. The first heating element 124 element wraps around the first side face 137, the top face 114 and the second side face 138 of each strip of phase change material 112. Thus, a section of the first heating element 124 is disposed against the first side face 137, another section of the first heating element 124 is disposed against the top face 114, and another section of the first heating element 124 is disposed against the second side face 138. This design produces a highly uniform temperature distribution throughout the strip of phase change material 112 during the set and reset pulses, as heat is directly applied to three faces of each strip.

Figure 3:
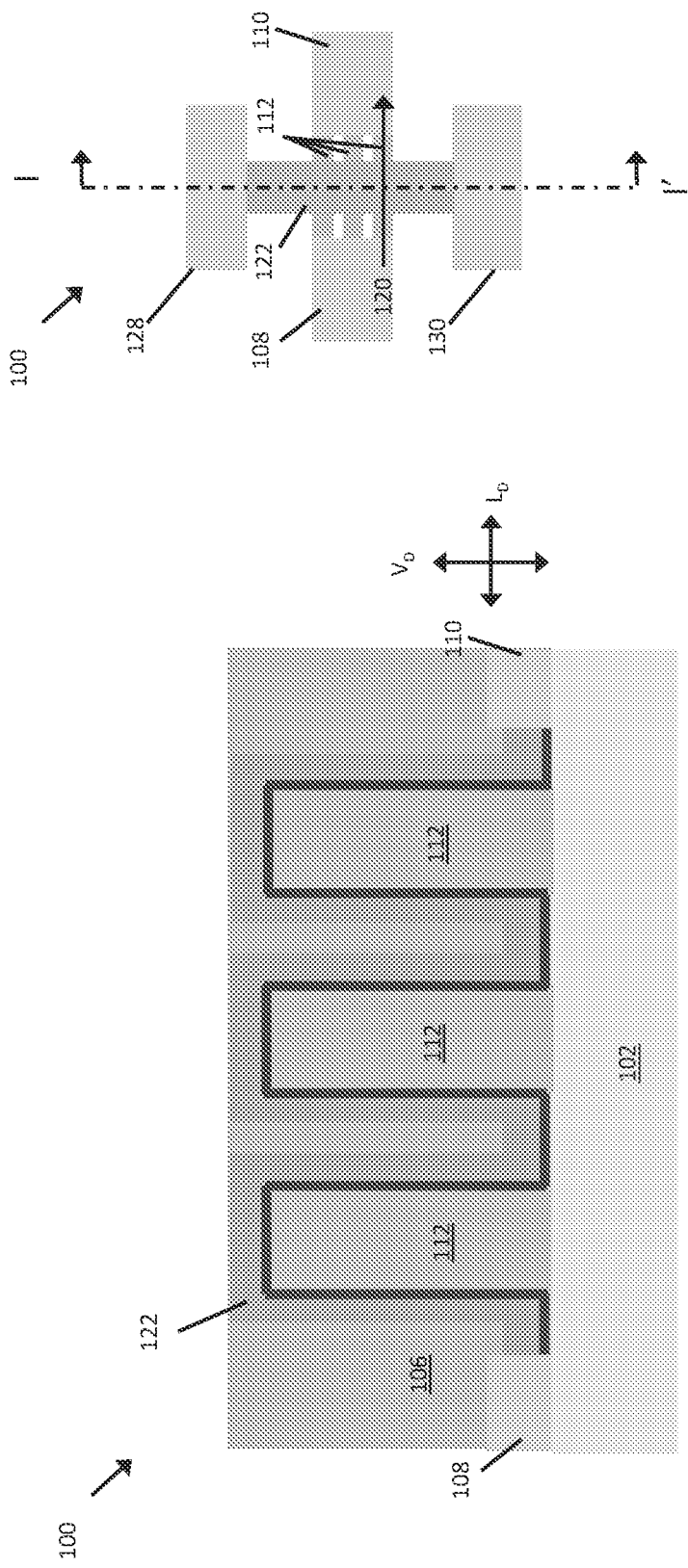
FIG. 3, which includes

Referring to FIG. 3, an example of a PCM switching device 100 with low aspect ratio strips of phase change material 112 is depicted, according to an embodiment. The PCM switching device 100 includes a plurality of the strips of phase change material 112 and sections of heating elements arranged alternatingly between each of the strips of phase change material 112, e.g., in an identical manner as described reference to FIG. 2. In this embodiment, the strips of phase change material 112 are elongated in a vertical direction ($V_D$) that is perpendicular to the main surface 104. In this context, "elongated in the vertical direction" encompasses any configuration wherein a height of the strip of phase change material 112 as measured in the vertical direction ($V_D$) is greater than a width of the strip of phase change material 112 as measured in a lateral direction ($L_D$) that is parallel to the main surface 104 and perpendicular to the current flow direction 120 of the strips of phase change material 112. In one specific example, the strips of phase change material 112 may have a height that is 5-10 times greater than their width. In absolute terms, the strips of phase change material 112 may have a height in the range of 1-3 µm and a width of 0.1-0.5 µm. The low aspect ratio arrangement produces a device with a favorable tradeoff between current carrying capacity and chip area.

Figure 4:
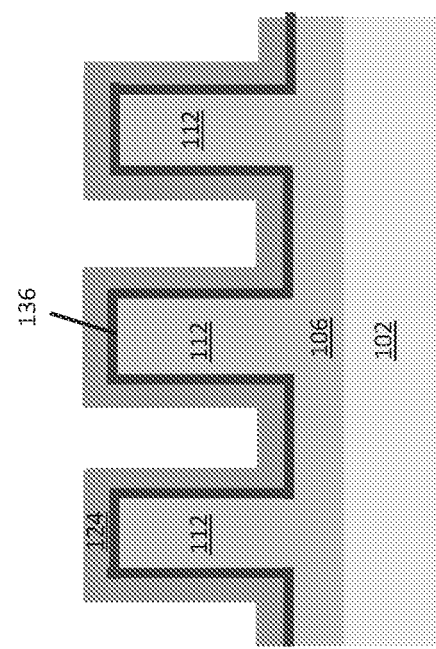
FIG. 4, which includes
Figure 4:
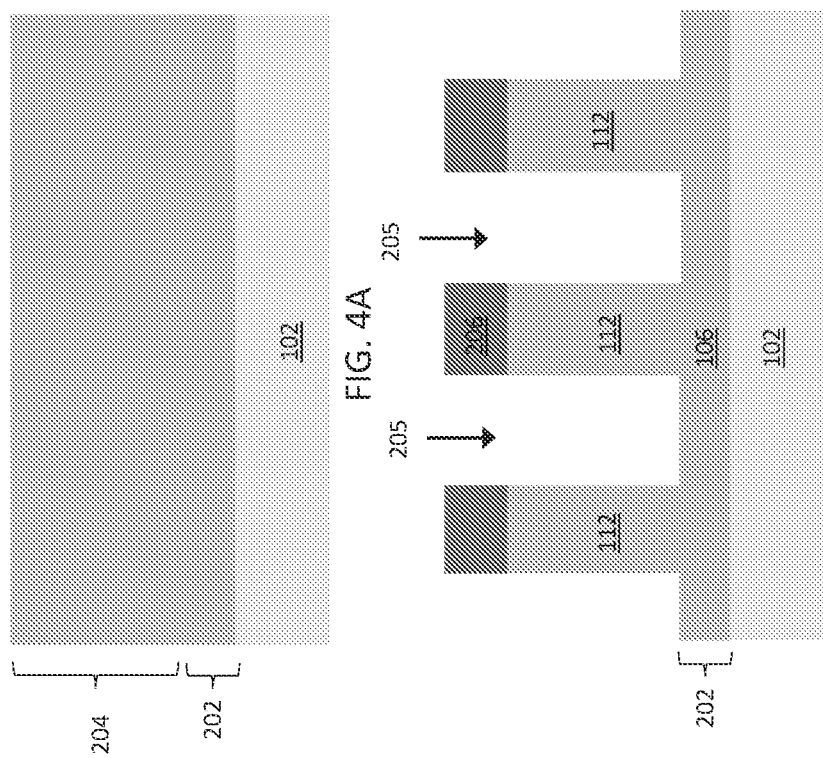

Referring to FIG. 4, a technique for forming the PCM switching device 100 is depicted, according to an embodiment. Initially, as shown in FIG. 4A, the substrate 102 is provided and a layer 202 of thermally insulating material is formed on the main surface 104, e.g., using deposition. Subsequently, a blanket layer 204 of phase change material is deposited on the layer 202 of thermally insulating material. Subsequently, as shown in FIG. 4B, the blanket layer 204 of phase change material 204 is structured using a patterned mask 206 that is formed on the blanket layer 204 of the phase change material. The patterned mask 206 may include an etch resistant material (e.g., oxide, photomask material, etc.), and the structuring of the blanket layer 204 may be performed using known etching techniques. The blanket layer of phase change material 204 is structured to include trenches 205 that extend completely to the layer 202 of thermally insulating material. As a result, the strips of phase change material 112 are formed by fin shaped structures corresponding to sections of the blanket layer 204 of phase change material that are between the trenches 205. The layer 202 of thermally insulating material forms the region of thermally insulating material 106 between the strips of phase change material 112 and the substrate 102. Subsequently, as shown in FIG. 4C, the patterned mask 206 is removed, and the first heating element 124 and the insulating liner 136 are formed over the fin shaped strips of phase change material 112. The first heating element 124 and the insulating liner 136 can be formed by a conformal deposition technique, e.g., chemical vapour deposition, wherein the insulating liner 136 is formed on all exposed faces of the phase change material and the region of thermally insulating material 106 and the heating element material is formed on the insulating liner 136 in a similar manner. As a result, the first heating element 124 wraps arounds the fins of phase change material.

Referring to FIG. 5, a PCM switching device 100 is depicted, according to another embodiment. Like the previously described embodiments, the PCM switching device 100 of FIG. 5 includes a plurality of the strips of phase change material 112 and sections of heating elements arranged alternatingly between each of the strips. In this case, the alternating arrangement of phase change material and heating elements is provided by trench structures that are formed in a region 140 of heating element material. The PCM switching device 100 of FIG. 5 includes a region 140 of heating element material that is disposed on the region of thermally insulating material 106. A plurality of trenches 142 is formed in an upper surface of the region 140 of heating element material that is parallel to the main surface 104. The phase change material in the trenches 142 provide the strips of phase change material 112, and the heater structure 122 is provided by sections from the region 140 of heating element material between the trenches 142.

In the depicted embodiment, the heater structure 122 is configured to force current through each of the heating elements in a direction that is parallel to the current flow direction 120 of the phase change material. As shown, the heater structure 122 includes an electrical interconnect structure 144 which contacts sections of the heating element material between each of the strips of phase change material 112. The electrical interconnect structure 144 may include a combination of metallization and/or electrical vias. In another embodiment, the heater structure 122 may be configured to force current through each of the heating elements in a direction that is parallel to the current flow direction 120 of the phase change material. This configuration can be obtained by forming the trenches 142 with heating element material underneath the trenches 142. As a result, a continuous span of the heating element material can extend across the strips of phase change material 112 in the current flow direction 120 of the phase change material.

Referring to FIG. 6, a technique for forming the PCM switching device 100 is depicted, according to an embodiment. Initially, as shown in FIG. 6A, the substrate 102 is provided and a thick layer or region 302 of the thermally insulating material is formed on the main surface 104. Subsequently, a region 140 of heating element material is formed. As shown in the depicted embodiment, a trench may be formed in the layer or region 302 of the thermally insulating material, and the region 140 of heating element material may be formed in this trench. Alternatively, the region 140 of heating element material may be formed as a blanket layer on top of a thinner layer of thermally insulating material. Subsequently, as shown in FIG. 6B, the region 140 of heating element material is structured using a patterned mask 304. The patterned mask 304 may include an etch resistant material (e.g., oxide, photomask material, etc.), and the structuring may be performed using known etching techniques. As a result of the structuring, a plurality of trenches 142 is formed in the region 140 of heating element material with discrete spans of the heating element material disposed on either side of the trenches 142. Subsequently, as shown in FIG. 6C, the patterned mask 304 is removed, and the strips of phase change material 112 and the insulating liner 136 are formed in each of the trenches 142. The strips of phase change material 112 and the insulating liner 136 may be formed by depositing the phase change material in the trenches 142, following by a planarization step (e.g., CMP (chemical-mechanical polishing) to remove excess material that forms above the trenches 142.

Figure 7:
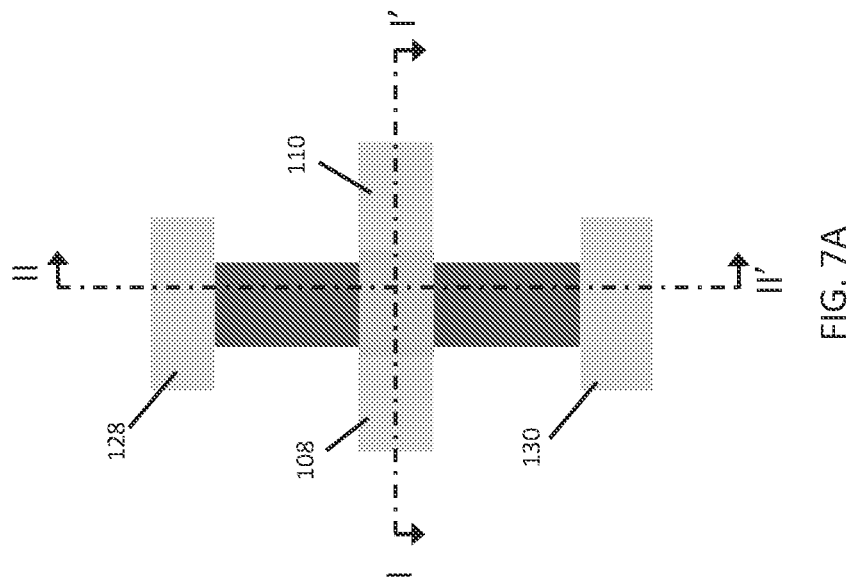
FIG. 7, which includes
Figure 7:
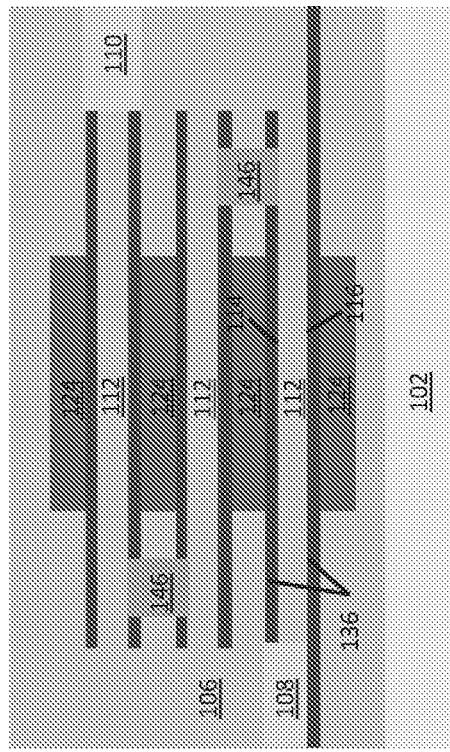
Figure 7:
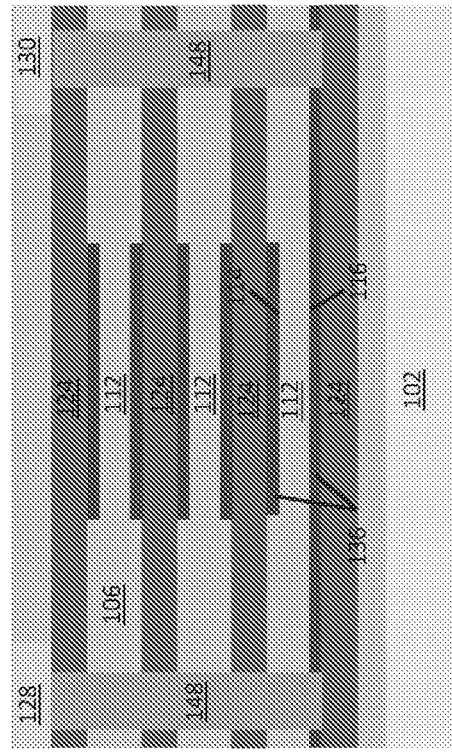

Referring to FIG. 7, a PCM switching device 100 is depicted, according to another embodiment. Like the previously described embodiments, the PCM switching device 100 of FIG. 7 includes a plurality of the strips of phase change material 112 and sections of heating elements 124 arranged alternatingly between each of the strips. In this embodiment, each of the strips of phase change material 112 are spaced apart from one another in a vertical direction ($V_D$) that is perpendicular to the main surface 104. The heater structure 122 includes a plurality of heating elements 124 arranged alternatingly between the strips of phase change material 112 in the vertical direction ($V_D$). Thus, the PCM switching device 100 of FIG. 7 is configured as a vertically layered stack of phase change material and heating elements. In this arrangement, the heating elements 124 are disposed against the top outer face 114 and the bottom outer face 116 of each strip of phase change material 112 and thus enable the advantageous temperature uniformity as described above for each strip.

In the PCM switching device 100 of FIG. 7 each of the strips of phase change material 112 are electrically connected in series between the between the first and second RF terminals 108, 110. This series configuration is made possible by electrically conductive via structures 146 that vertically extend through the thermally insulating material 106 and form an electrical connection between immediately adjacent strips of phase change material 112. These via structures 146 can be tungsten or polysilicon plugs, for example. A lowermost one of the strips of phase change material 112 is electrically connected to the first RF terminal 108, and an uppermost one of the strips of phase change material 112 is electrically connected to the second RF terminal 110. As a result, the strips of phase change material 112 form a single current path between the first and second RF terminals 108, 110. The PCM switching device 100 of FIG. 7 includes vertical electrical connectors 148 that electrically connect the first heating terminal 128 with each of the heating elements 124 at one end, and electrically connect the second heating terminal 130 with each of the heating elements 124 at an opposite end. These vertical electrical connectors 148 may include conductive metals or highly doped polysilicon, for example.

Figure 8:
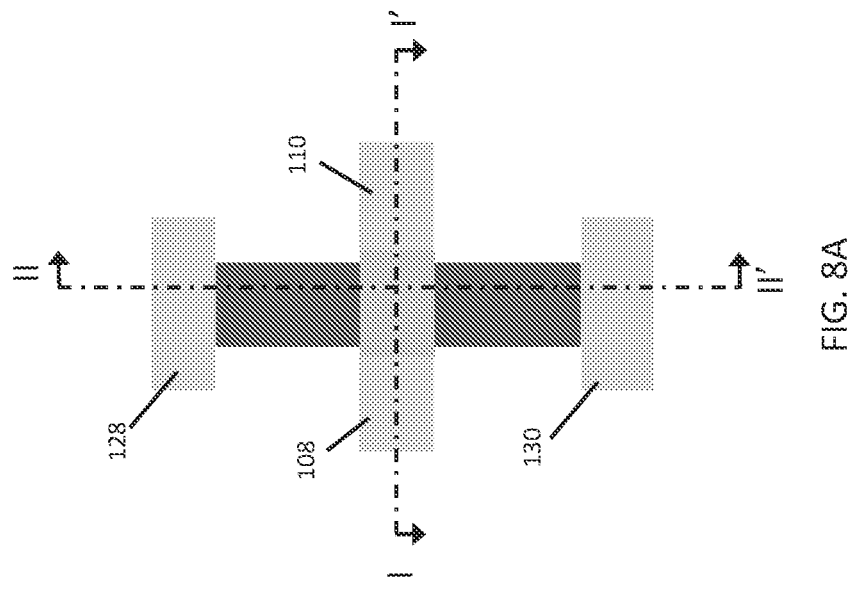
FIG. 8, which includes
Figure 8:
Figure 8:
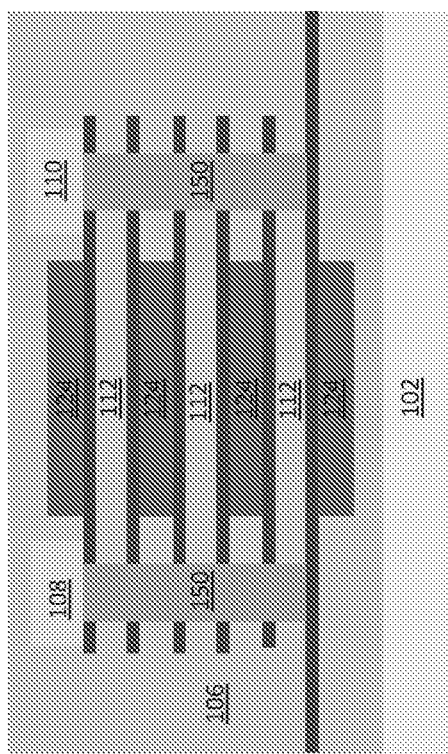
Figure 8:
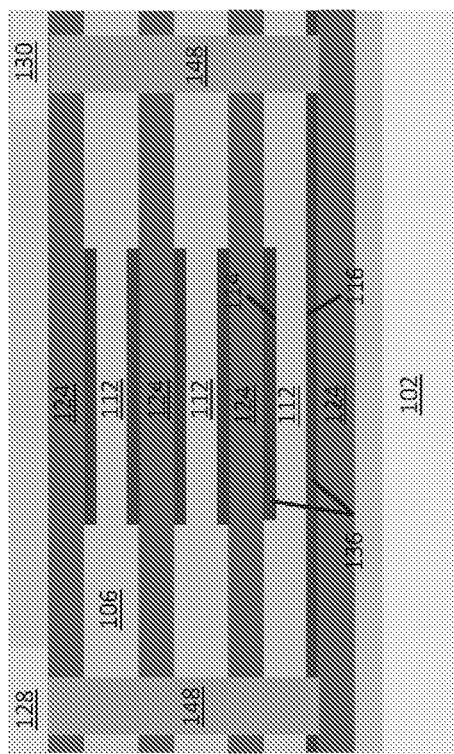

Referring to FIG. 8, a PCM switching device 100 is depicted, according to another embodiment. The embodiment of FIG. 8 is substantially identical to that of FIG. 7, except that each of the strips of phase change material 112 are electrically connected in parallel between the first and second RF terminals 108, 110. The parallel configuration is made possible by vertical electrical connectors 150 that electrically connect the first RF terminal 108 with each strip of phase change material 112 and electrically connect the second RF terminal 110 with each strip of phase change material 112 at an opposite end. These vertical electrical connectors 150 may include conductive metals or highly doped polysilicon, for example.

The vertically stacked configuration of the PCM switching device 100 in either of the embodiments of FIGS. 7 and 8 offers advantageous space efficiency by providing multiple strips of phase change material 112 on top of one another. While the depicted embodiment shows a layered stack of three strips of phase change material 112, in principle this concept may be extended to stacks of tour, five, etc. As a result, a PCM switching device 100 with favorable performance benefits, e.g., voltage blocking, current capacity, on-resistance, etc., can be obtained within a small areal footprint.

The vertically stacked design of the PCM switching devices 100 of FIGS. 7 and 8 can be obtained through successive deposition of a layer of the heating element material, a layer of the insulating liner, a layer of the phase change material, another layer of the insulating liner, and so forth. The strips of phase change material 112 and heating elements 124 can be structured using known techniques.

FIGS. 2-8 illustrate exemplary embodiments of a PCM switching device 100 with a plurality of the strips of phase change material 112. In each of the depicted examples, the heater structure 122 is configured such that heating elements are disposed against two outer faces of each strip of phase change material 122. In other embodiments which include multiple strips of phase change material 112, the heater structure 122 is configured such that heating elements are disposed against two outer faces of a first strip of phase change material 112 and such that heating elements are disposed against only one outer face of a second strip of phase change material 112. Using FIG. 5C to illustrate this concept, an outer one of the trenches 142 may be formed such that there is no heating element material between an outer sidewall of the trench 142 and the thermally insulating material 106. As a result, the strip of phase change material 112 in the outer trench 142 includes an inner side face that is against the heating element material and an outer side face that does not face any heating element material. In this arrangement, the central strip of phase change material 112 includes two side outer faces that are disposed against the heating element material. More generally, this concept can be applied to any embodiment which includes a plurality of the strips of phase change material 112, including the specific embodiments shown in FIGS. 2-8.

The term "electrically connected," "directly electrically connected" and the like as used herein describes a permanent low-impedance connection between electrically connected elements, for example a direct contact between the relevant elements or a low-impedance connection via a metal and/or a highly doped semiconductor.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a switching device, the method comprising:
   providing a substrate comprising a main surface;
   forming a layer of thermally insulating material on the main surface;
   forming one or more strips of phase change material on the layer of thermally insulating material such that the one or more strips of phase change material are separated from the main surface by a region of the thermally insulating material;
   forming first and second RF terminals on the main surface that are laterally spaced apart from one another and connected to the one or more strips of phase change material; and
   forming a heater structure comprising one or more heating elements that are configured to control a conductive connection between the first and second RF terminals by applying heat to the one or more strips of phase change material,
   wherein each of the one or more strips of phase change material comprises a first outer face and a second outer face opposite from the first outer face, and wherein for at least one of the one or more strips of phase change material, at least portions of both of the first and second outer faces are disposed against one of the heating elements, wherein forming the sections of the one or more heating elements comprises depositing a plurality of layers of heating element material that are stacked on top of one another in a vertical direction that is perpendicular to the main surface, and wherein forming the plurality of the strips of phase change material comprises depositing layers of the phase change material alternatingly between the of layers of heating element material.

2. The method of claim 1, wherein each of the strips of phase change material are formed to be spaced apart from one another in a vertical direction that is perpendicular to the main surface, and wherein the heater structure is formed to comprise a plurality of the heating elements arranged alternatingly between the strips of phase change material in the vertical direction.

3. The method of claim 2, wherein each of the strips of phase change material is electrically connected in series with one another the between the first and second RF terminals.

4. The method of claim 2, wherein each of the strips of phase change material is electrically connected in parallel with one another between the between the first and second RF terminals.

* * * * *

UNITED STATES PATENT AND TRADEMARK OFFICE
CERTIFICATE OF CORRECTION

PATENT NO. : 12,156,488 B2  
APPLICATION NO. : 18/086211  
DATED : November 26, 2024  
INVENTOR(S) : D. Heiss et al.

Page 1 of 1

It is certified that error appears in the above-identified patent and that said Letters Patent is hereby corrected as shown below:

In the Claims

Column 13, Line 22 (Claim 3, Line 3), please change "another the between" to -- another between --.

Column 13, Line 25 (Claim 4, Line 3), please change "between the between the" to -- between the --.

Signed and Sealed this  
Twenty-eighth Day of January, 2025

Coke Morgan Stewart  
*Acting Director of the United States Patent and Trademark Office*